(12) United States Patent
Zhao et al.

(10) Patent No.: US 10,126,402 B2
(45) Date of Patent: Nov. 13, 2018

(54) MAGNETIC RESONANCE IMAGING (MRI) WITH ARTIFACT-FREE T2 MAPPING

(71) Applicant: Case Western Reserve University, Cleveland, OH (US)

(72) Inventors: Tiejun Zhao, Pittsburgh, PA (US); Kecheng Liu, Solon, OH (US); Dan Ma, Cleveland Heights, OH (US); Mark Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 684 days.

(21) Appl. No.: 14/728,160

(22) Filed: Jun. 2, 2015

(65) Prior Publication Data

US 2016/0356872 A1    Dec. 8, 2016

(51) Int. Cl.
*G01V 3/00* (2006.01)
*G01R 33/565* (2006.01)
*G01R 33/50* (2006.01)

(52) U.S. Cl.
CPC ......... *G01R 33/5659* (2013.01); *G01R 33/50* (2013.01)

(58) Field of Classification Search
CPC .. G01R 33/34; G01R 33/34007; G01R 33/36; G01R 33/3635; G01R 33/3642; G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612; G01R 33/583; G01R 33/5659; G01R 33/56518; G01R 33/56536; G01R 33/56572; G01R 33/5614; G01R 33/5616; G01R 33/56509; G01R 33/341;

(Continued)

(56) References Cited

U.S. PATENT DOCUMENTS

| | | | | |
|---|---|---|---|---|
| 5,570,019 | A | * | 10/1996 | Moonen ............. G01R 33/4833 324/307 |
| 6,664,787 | B2 | * | 12/2003 | Miyoshi ............... G01R 33/565 324/307 |

(Continued)

*Primary Examiner* — Thang Le
(74) *Attorney, Agent, or Firm* — Quarles & Brady LLP

(57) ABSTRACT

Example apparatus and methods provide improved quantitative T2 mapping for magnetic resonance imaging (MRI). Conventional T2 (spin-spin) mapping in MRI may employ a spin echo with multiple echoes (SEMC) approach like the Carr-Purcell-Meiboom-Gill (CPMG) spin echo sequence. These conventional approaches may be negatively impacted by a slice profile effect that incorrectly and undesirably lowers the signal of a first echo and by a stimulated echo effect that incorrectly and undesirably raises the signal for even echoes. Example apparatus mitigate these issues by using a T2 preparation phase that uses three dimensional (3D) non-slice selective block RF pulses followed by a multi-echo data acquisition that uses an in-out k-space trajectory. The multi-echo acquisition may employ k-space segmentation to acquire one line of partition encodings per T2 preparation phase. While conventional systems mix T2 preparation and multi-echo acquisition, example apparatus and methods separate T2 preparation and multi-echo acquisition.

13 Claims, 17 Drawing Sheets

(58) Field of Classification Search
CPC ........................ G01R 33/385; G01R 33/56358; A61B 5/055; A61B 5/0555; A61B 5/7278; A61B 5/725
USPC .................................................. 324/300–322
See application file for complete search history.

(56) References Cited

U.S. PATENT DOCUMENTS

| | | | |
|---|---|---|---|
| 6,807,441 B2* | 10/2004 | Schmainda | A61B 5/055 600/419 |
| 9,360,542 B2* | 6/2016 | Reeder | G01R 33/56563 |
| 2013/0141096 A1* | 6/2013 | Bottomley | G01R 33/50 324/309 |
| 2016/0139225 A1* | 5/2016 | Basha | G01R 33/36 324/309 |
| 2016/0154081 A1* | 6/2016 | Chung | G01R 33/56563 324/309 |

* cited by examiner

Prior Art Figure 1

MAGNETIC RESONANCE IMAGING (MRI) WITH ARTIFACT-FREE T2 MAPPING

BACKGROUND

Nuclear magnetic resonance (NMR) causes spins to excite and then to relax. The relaxation may be T1 (spin-lattice) relaxation or T2 (spin-spin) relaxation. Theoretically, data acquired during the relaxation ought to follow idealized curves. In practice, data that produces less than ideal relaxation curves may be acquired. Conventional T2 mapping in magnetic resonance imaging (MRI) may employ a spin echo with multiple echoes (SEMC) approach like the Carr-Purcell-Meiboom-Gill (CPMG) sequence. These conventional approaches may be negatively impacted by a slice profile effect that artificially lowers the signal of a first echo and by a stimulated echo effect that artificially raises the signal for even echoes.

T2 mapping may be used in MRI to reveal biomarkers that may identify pathological changes in a patient. Conventional T2 mapping may have produced qualitative images that were suitable for subjective interpretation by radiologists. However, conventional T2 mapping may have produced sub-optimal or even unacceptable results when quantitative T2 analysis was desired.

Recall that in MRI, B0 refers to the constant, homogeneous magnetic field used to polarize spins, creating magnetization. This can refer to both the direction and the magnitude of the field. The direction of B0 defines the longitudinal axis. Recall also that B1 refers to a radio frequency (RF) energy field applied perpendicular to the longitudinal axis (B0) to perturb the magnetization in some manner (e.g., excitation pulses, inversion pulses).

Conventional SEMC techniques have faced at least two challenges. First, SEMC may have a non-ideal slice profile for a two dimensional (2D) acquisition. Second, SEMC may undesirably stimulate echoes due to an inhomogeneous B1 field that causes imperfect refocusing of 180 degree refocusing RF pulses. The imperfectly refocused pulses may stimulate undesired echoes. These two challenges may have caused what should have been a purely exponential decay curve for T2 data to be less than the predicted ideal.

In SEMC, slice profiles and the effects of B1 inhomogeneity may vary from MRI system to MRI system. Additionally, in SEMC, the effects of B1 inhomogeneity and non-ideal slice profile may vary based on different imaging protocol parameter selections. Given different imaging parameters on different systems, a T2 map produced using SEMC may have significant deviations from an ideal.

Prior Art FIG. 1 illustrates a traditional spin-echo pulse sequence that produces multiple echoes for T2-mapping. In this conventional approach, T2 weighting and acquisition are mixed together. Mixing T2 weighting and acquisition may have reduced acquisition time, but may also have produced additive errors that compounded for later echoes. An acquisition scheme of four different T2 weighted images (I1, I2, I3, I4) with different echo times (TE) are illustrated. With ideal CPMG-SEMC sequence conditions, signals with different TEs should, theoretically, present mono-exponential decay curves for single uniform protons. T2 parameter maps could then be calculated by fitting to the mono-exponential decay model. Unfortunately conventional SEMC approaches have not yielded the mono-exponential decay curves.

The traditional spin echo pulse sequence in prior art FIG. 1 includes an initial 90 degree RF pulse 110 that is active while the slice select gradient GS is active. Phase encoding may then be applied using a phase gradient GP and read gradient GR. A 180 degree RF pulse 120 may then be applied while the slice select gradient GS is active. A first echo S1 may then be acquired while the readout gradient GR is active. S1 will typically be too low due to the imperfect slice profile effect. Echoes S2, S3, and S4 may then be acquired while the readout gradient GR is active following 180 degree refocusing RF pulses 130, 140, and 150. S2 and S4 will typically be too high due to the stimulated echo effect.

Conventional CPMG-SEMC that uses slice selective RF pulses for 2D acquisitions yield imperfect slice profiles. FIG. 2 illustrates an example imperfect slice profile 220. A 2D slice select pulse 200 may have been intended to produce an ideal slice profile 210 but may instead have produced an imperfect slice profile 220. The effect of the imperfect slice profile 220 may vary inversely with the size of the slice. For example, a thinner slice may experience a greater impact than a thicker slice. The effective flip angle within a desired slice may not be homogenous, particularly at the excitation transition. Additionally, since the B1 field may not be homogenous in a selected volume, and since the B1 field is related to the refocusing RF pulse, the different echo signals that are acquired may produce non-ideal decay curves. For example, when the B1 field is inhomogeneous, in some locations the 180 degree refocusing RF pulse may achieve a flip angle of 180 degrees but in other locations the flip angle may be less than 180 degrees.

FIG. 3 illustrates data associated with an actual T2-related decay that is not an ideal exponential function. The data in FIG. 3 was acquired using conventional CPMG-SEMC with slice excitation and refocusing pulses. In this type of acquisition the first echo 310 may provide lower than ideal signal intensity due to an imperfect slice profile. For example, the excitation and first refocusing RF pulse may cause a first echo 310 to have a lower than expected or lower than ideal signal intensity. Additionally, even echoes (e.g., 320, 340) may produce higher than ideal signal intensities due to superimposed echoes. For example, when the refocusing RF pulse flip angle is less than 180 degrees due to the non-ideal slice profile, stimulated echoes may superimpose on even echo signals and thus yield a higher than expected or higher than ideal signal intensity.

FIG. 4 illustrates a simplified view of errors associated with a conventional pulse sequence. An ideal exponential curve 400 is provided. Initial echo 410 may depend on an initial 90 degree RF pulse (e.g., pulse 110, FIG. 1) and an initial 180 degree RF pulse (e.g., pulse 120, FIG. 1). Initial echo 410 will typically be lower than it should be due to the imperfect slice profile effect. Second echo 420 may depend on an initial 90 degree RF pulse (e.g., pulse 110, FIG. 1), an initial 180 degree RF pulse (e.g., pulse 120, FIG. 1), and a subsequent 180 degree RF pulse (e.g., pulse 130, FIG. 1). Second echo 420 may be larger than it should be due to the stimulated echo effect. Note that the second echo 420 depends on three RF pulses, each of which may introduce some error. Thus, there may be more compound error effects on second echo 420 than on first echo 410. Additionally, the errors may be different for the different echoes, which may make it difficult, if even possible at all, to account for the variable and compounding errors. Third echo 430 may depend on an initial 90 degree RF pulse (e.g., pulse 110, FIG. 1), an initial 180 degree RF pulse (e.g., pulse 120, FIG. 1), a subsequent 180 degree RF pulse (e.g., pulse 130, FIG. 1), and another subsequent 180 degree RF pulse (e.g., pulse 140, FIG. 1). Third echo 430 may be different than it should be due to compounded errors. Note that the third echo 430 depends on four RF pulses, each of which may introduce some different error. Thus, there may be more compound error effects on third echo 430 than on earlier echoes. Fourth echo 440 may depend on an initial 90 degree RF pulse (e.g., pulse 110, FIG. 1), an initial 180 degree RF pulse (e.g., pulse 120, FIG. 1), a subsequent 180 degree RF pulse (e.g., pulse 130, FIG. 1), another subsequent 180 degree RF pulse (e.g., pulse 140, FIG. 1), and another subsequent 180 degree RF pulse (e.g., pulse 150, FIG. 1). Fourth echo 440 may be different than it should be due to compounded errors and may be greater than it should be due to the stimulated echo effect. Note that the fourth echo 440 depends on five RF pulses, each of which may introduce some different error. Thus, there may be more compound error effects on the fourth echo 440 than on earlier echoes. While conventional spin echo sequences that acquired multiple echoes may have reduced acquisition time, the value of the later echoes may have been questionable.

The accuracy of the T2 mapping associated with a conventional sequence may depend most on the first echo 410 and the second echo 420. However, both of these echoes exhibit significant errors. Thus, not only may the later echoes have had questionable value, but the first two echoes, which are most significant to T2 accuracy, may have been fundamentally flawed. Additionally, since the later echoes depend on multiple errors that may have each been different, it may be difficult, if even possible at all, to account for the variable and compounding errors.

The fluctuations and deviations may be related to the T2 value(s) for a given tissue. For example, larger T2 values for the measured species may produce larger deviations. FIG. 5 illustrates the impact of T2 values on system performance. FIG. 5 shows that species having longer T2 and/or T1 values may present more significant deviations than species having shorter T2 and/or T1 values. More generally, the magnitude of the slice select effect and the magnitude of the stimulated echo effect may vary directly with the T2 length.

Conventional attempts to address these issues with 2D CPMG-SEMC have included elaborately designed RF pulses and post-processing. The refinement and elegance of elaborately designed RF pulses may have been limited by bandwidth considerations, digitization considerations, and system performance (e.g., RF chain). Post-processing may have attempted to correct for the stimulated echo effect by modeling signal pathways or selectively using different echo signals for exponential fitting. Post-processing methods may still be vulnerable to MRI system performance, image parameter selections, and T2 ranges. While substantial efforts may have been attempted, the systemic problems and variably compounding errors may have limited the value of conventional approaches for quantitative T2 mapping.

BRIEF DESCRIPTION OF THE FIGURES

Prior Art

DETAILED DESCRIPTION

Conventional T2 mapping in MRI may employ a spin echo with multiple echoes (SEMC) approach like the Carr-Purcell-Meiboom-Gill (CPMG) spin echo sequence. These conventional approaches may be undermined by a slice profile effect that incorrectly lowers the signal of a first echo and a stimulated echo effect that incorrectly raises the signal for even echoes. Example apparatus mitigate these issues by using a T2 preparation phase that uses 3D non-slice selective block RF pulses followed by a data acquisition phase that uses an in-out k-space trajectory. The in-out k-space trajectory may use k-space segmentation to acquire one line of partition encodings per T2 preparation phase.

Conventional approaches mixed T2 weighting and signal acquisition. Example apparatus and methods keep T2 weighting and signal acquisition separate. Conventional approaches produced multiple echoes. Members of the multiple echoes resulted from different RF energy and different errors. The different errors may have compounded making it difficult to impossible to account for the error. Example apparatus and methods also produce multiple echoes. However, members of the multiple echoes result from the same RF energy and experience the same error. Since the error, if there is any, is substantially identical, it is possible to account for the error.

Example apparatus and methods provide improved T2 mapping with SEMC using dedicated T2 preparation with 3D acquisitions. Example apparatus and methods differ from conventional systems by using 3D non-slice selective block RF pulses in a T2 preparation phase of a pulse sequence. Volume excitation for 3D acquisition makes the imperfect slice select effect associated with 2d slice acquisition irrelevant. Example 3D non-slice selective block RF pulses may have a wide bandwidth (e.g., 500 ms-1500 ms). Example apparatus and methods mitigate the impact of imperfect slice profiles. Example apparatus and methods use a 90x, 180y, 90x preparation followed by acquisition of multiple echoes. The 90x, 180y, 90x pulses may be separated by a time τ. There may be multiple 180y pulses. TE refers to echo time, n is the number of 180y pulses and τ delays, τ is a period of time (e.g., 3 ms). 90x refers to tipping an initial alignment produced by initial magnetization (M0) 90 degrees along a first axis (e.g., x axis) to produce a resulting alignment. 180y refers to tipping the resulting alignment along a second, different axis (e.g., y axis). The 90x, 180y, 90x preparation followed by a gradient spoiling and signal acquisition mitigates the impact of stimulated echoes due to B1 inhomogeneity.

Example apparatus and methods are not constrained by the CPMG-SEMC sequence and thus can use acceleration techniques including, for example, spiral acquisition, parallel acquisition, or compressed SENSE.

Figure 1:
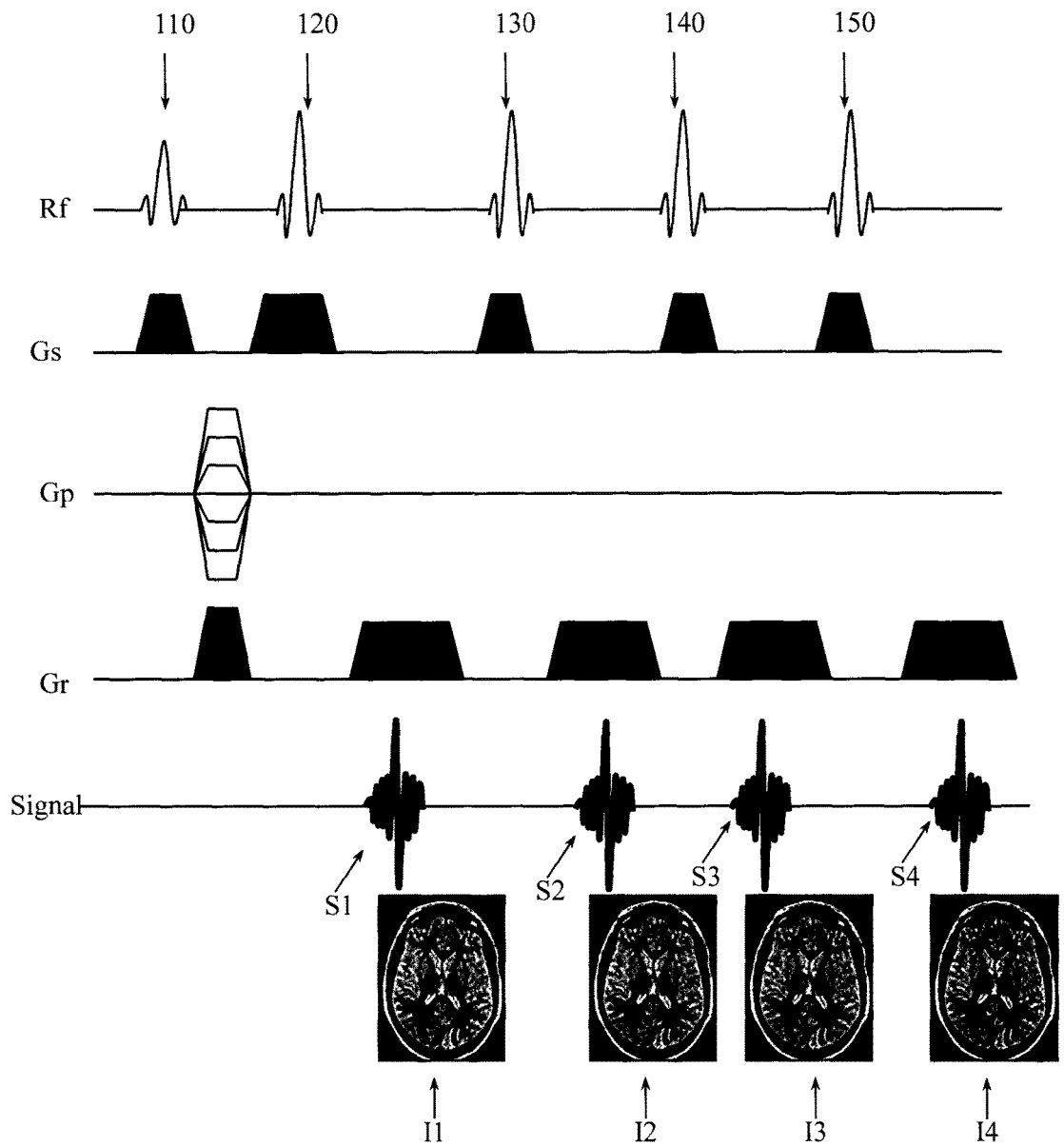
FIG. 1 illustrates a traditional spin-echo sequence with multiple echo acquisition for T2-mapping.
Figure 2:
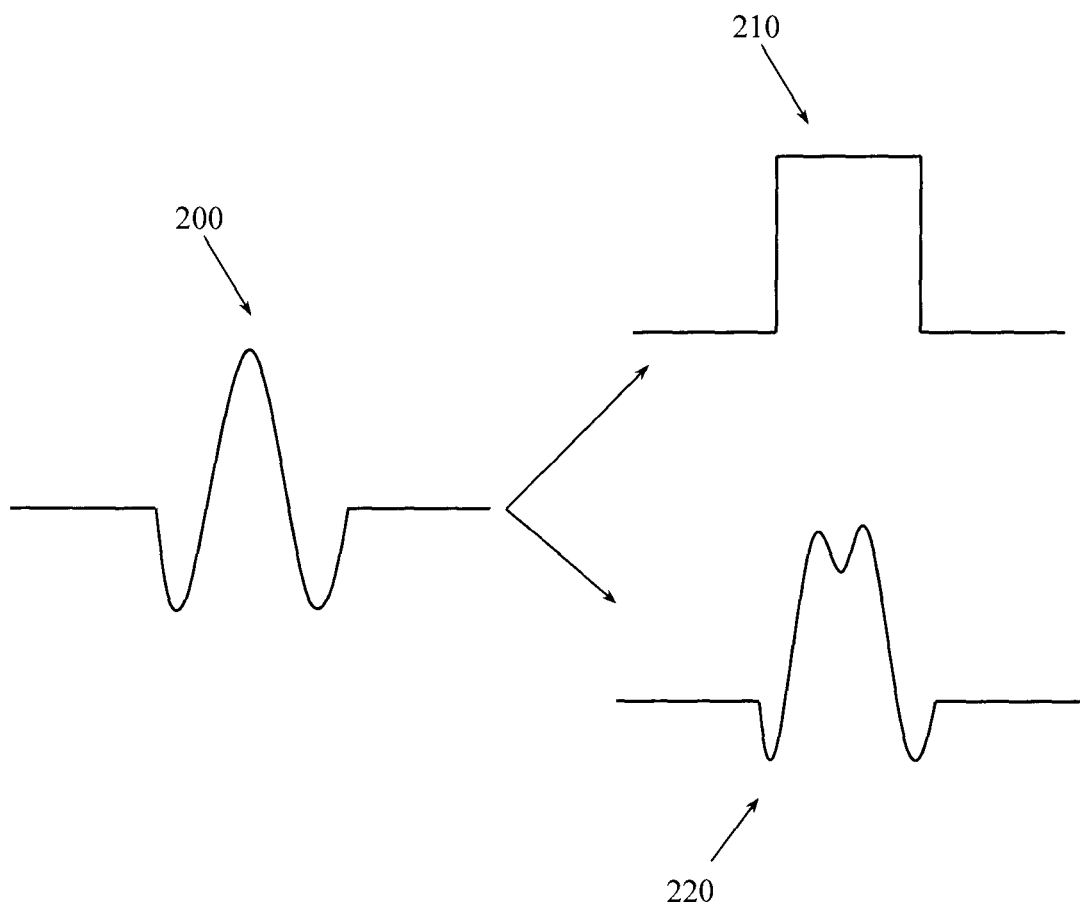
FIG. 2 illustrates an imperfect slice profile versus an ideal slice profile.
Figure 3:
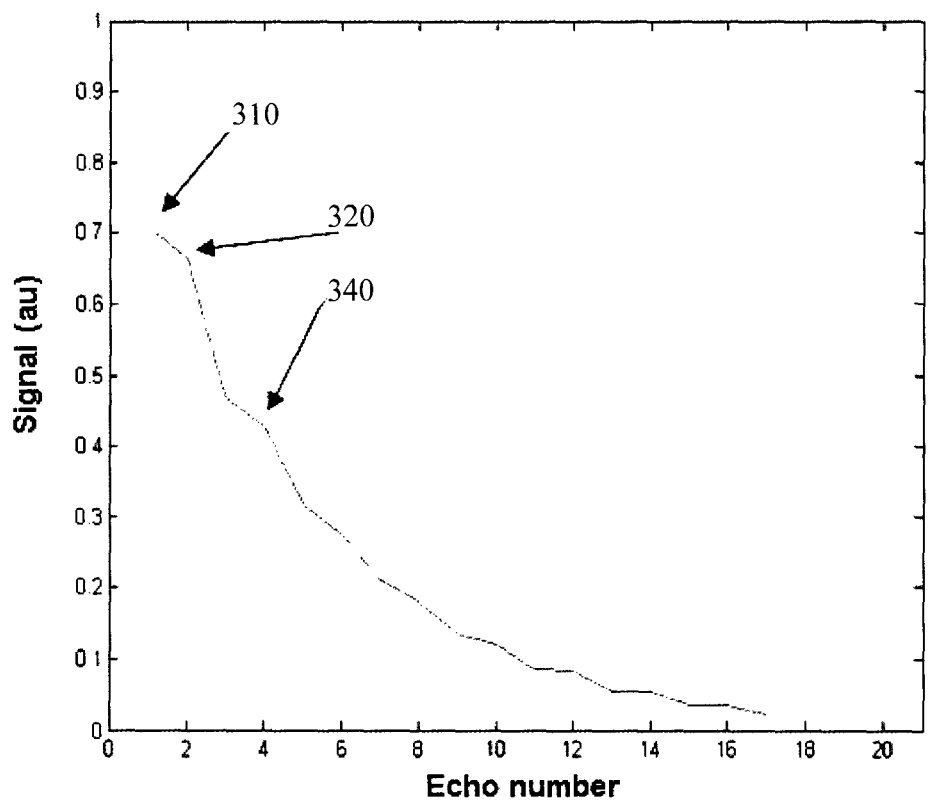
FIG. 3 illustrates measured T2-related decay that is not an ideal exponential function as illustrated by even echoes presenting hyper signal intensity while the first echo presents a lower signal intensity.
Figure 4:
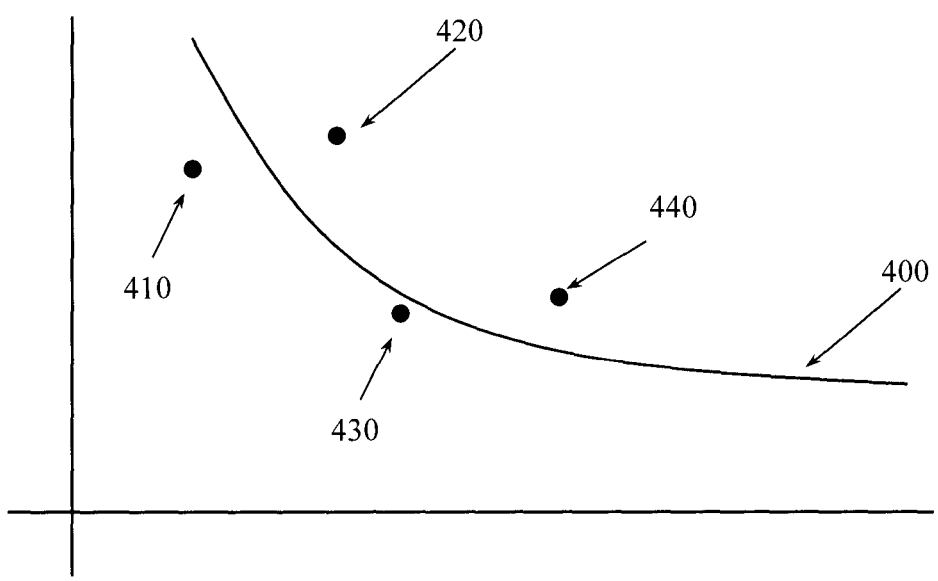
FIG. 4 illustrates a simplified view of a fitting curve versus measured data by conventional systems.
Figure 5:
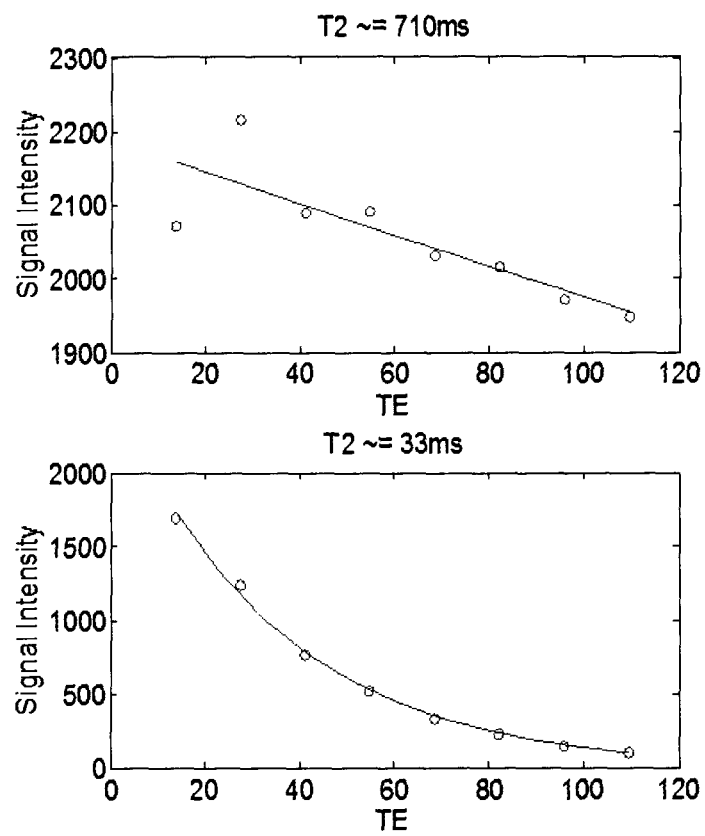
FIG. 5 illustrates impacts of fitting and measured data with different T2 values (long and short) using conventional SEMC.
Figure 6:
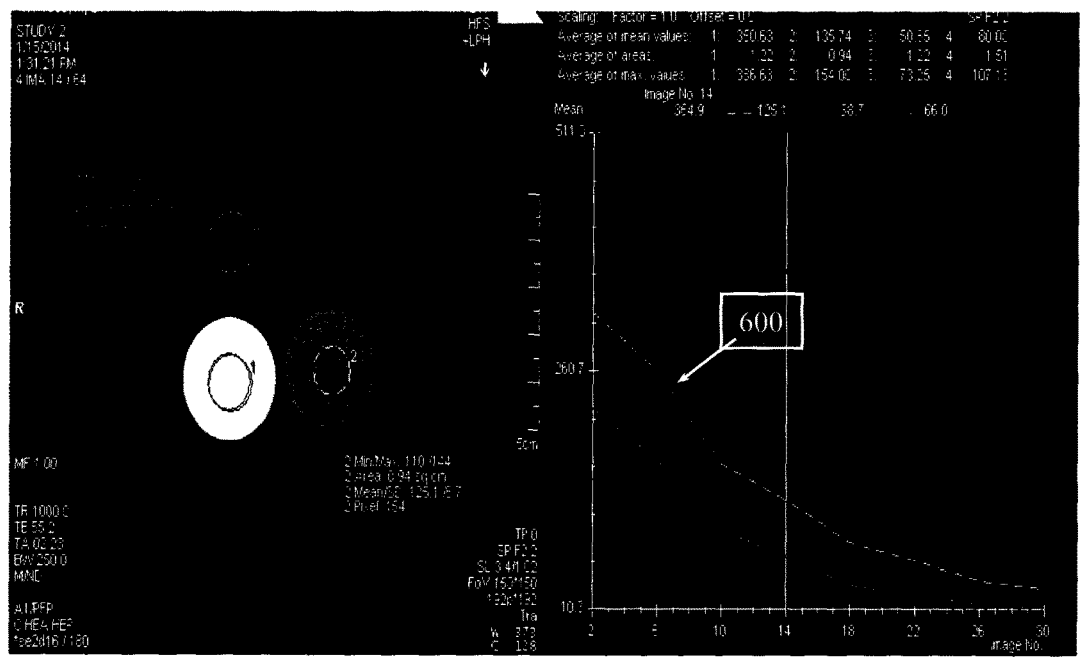
FIG. 6 illustrates the slice profile effect and the stimulated echo effect for a conventional CPMG-SEMC based acquisition.
Figure 7:
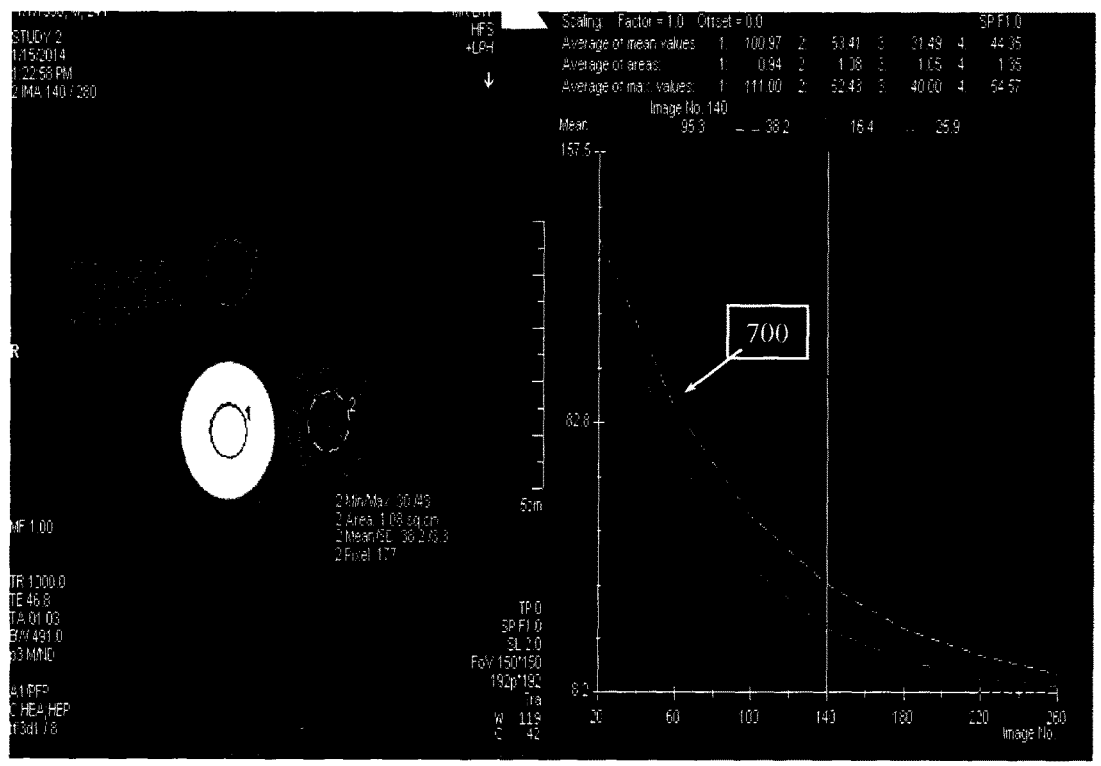
FIG. 7 illustrates improved performance of example apparatus and methods.

FIG. 6 illustrates the slice profile effect (e.g., lower signal on first echo) and the stimulated echo effect (e.g., higher signal on following even echoes) for a conventional CPMG-SEMC based acquisition that acquires eight echo signals. FIG. 7 illustrates results that demonstrate how example apparatus and methods mitigate the slice profile effect and the stimulated echo effect. Comparing curves 600 and 700 reveals the improvements achieved by example apparatus and methods. Curve 600 has an irregular shape and does not look like an ideal exponential decay. Curve 700 has a more regular shape and more ideal exponential decay.

Figure 8:
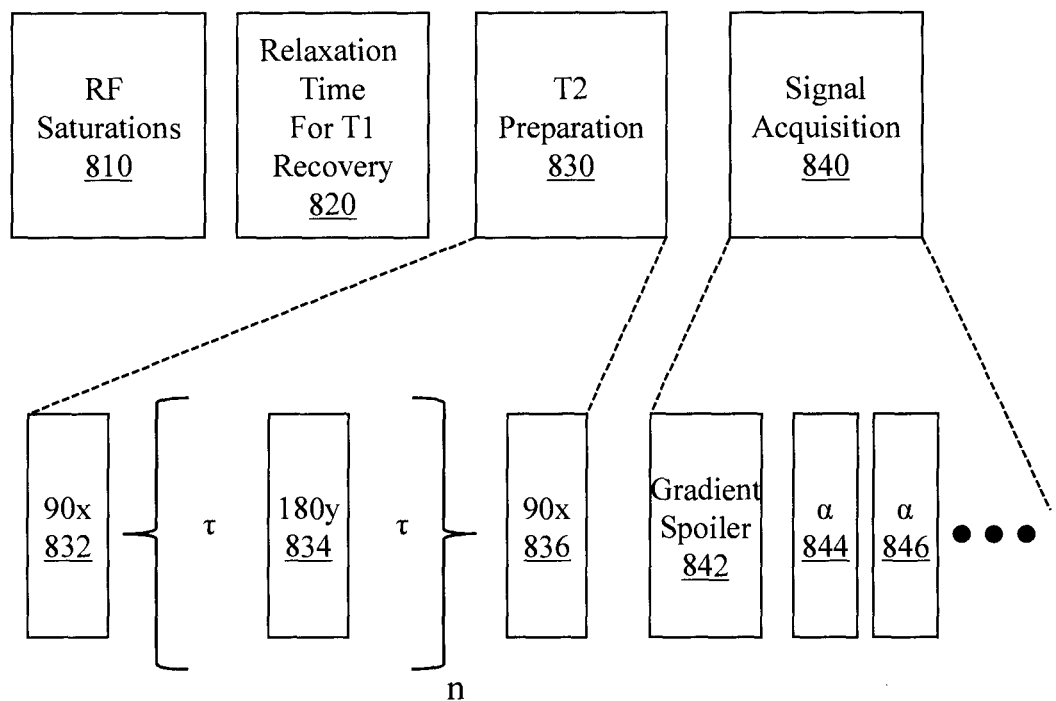
FIG. 8 illustrates an example pulse sequence that includes a separate T2 preparation phase.

FIG. 8 illustrates an example pulse sequence that includes T2 preparation 830 followed by fast signal acquisition 840. Unlike conventional systems where T2 weighting and signal acquisition are mixed, T2 preparation 830 and signal acquisition 840 are separate. In one embodiment, the T2 preparation 830 may be preceded by RF saturations 810 and a pause for T1 relaxation recovery 820. Recall that T1 relaxation time is longer than T2 relaxation time.

The T2 preparation 830 includes non slice-selective block RF pulses 832, 834, and 836 having a wide bandwidth (e.g., 500-150 ms) that do T2 preparation for an entire 3D volume. The T2 preparation 830 may include RF pulses of 90x, 180y, 90x that are non-slice selective. 90x refers to a 90 degree RF pulse that tips alignment along a first axis (e.g., x axis). 180y refers to a 180 degree RF pulse that tips alignment along a second, different, axis (e.g., y axis) that is orthogonal to the first axis. The 90x, 180y, 90x pulses may be separated by a time τ. There may be multiple (e.g., n) instances of the 180y pulse. Instances of the 180y pulse may also be separated by time τ. The echo time (TE) for generated echoes is related to the number (n) of 180y pulses and the time τ.

In one embodiment, TE=n*τ where n=the number of 180y pulses.

Signal acquisition 840 may include gradient spoiling 842 and echo detection. After gradient spoiling 842, a number of echoes α1 844, α2 846, . . . αn may be acquired. The multiple echoes will result from the same RF pulses from T2 preparation 830. Therefore, errors introduced during T2 preparation 830 will be common to α1 844, α2 846, . . . αn and can be accounted for. Recall that in conventional approaches, echoes resulted from different RF pulses and thus experienced different errors that may have compounded. In conventional approaches it may have been impossible to account for the errors.

Example apparatus and methods first perform the T2 preparation 830 and then perform the data acquisition 840. T2 preparation 830 and data acquisition 840 may be repeated one or more times. In one example, a 3D turbo-FLASH acquisition may be used for the data acquisition 840. The data acquisition 840 may use a center coding scheme that follows an in-out k-space trajectory. K-space segmentation may be employed. The acquisition window following the T2 preparation 830 may be limited in range. In one embodiment, the T2 preparation 830 will be limited and the acquisition window during which data acquisition 840 will occur will be limited.

In one embodiment, one line of partition encodings will be collected using an in-out k-space trajectory per T2-preparation phase. In one embodiment that uses a Turbo-FLASH acquisition, repetition time (TR) is approximately 3 ms. In this embodiment, the total acquisition window may be approximately 100 ms for 32 partitions. In different embodiments, acquisition may be accelerated using, for example, parallel acquisition, under-sampling with phase array MRI coils, spiral sampling, or multi-band multi-slices.

Figure 9:
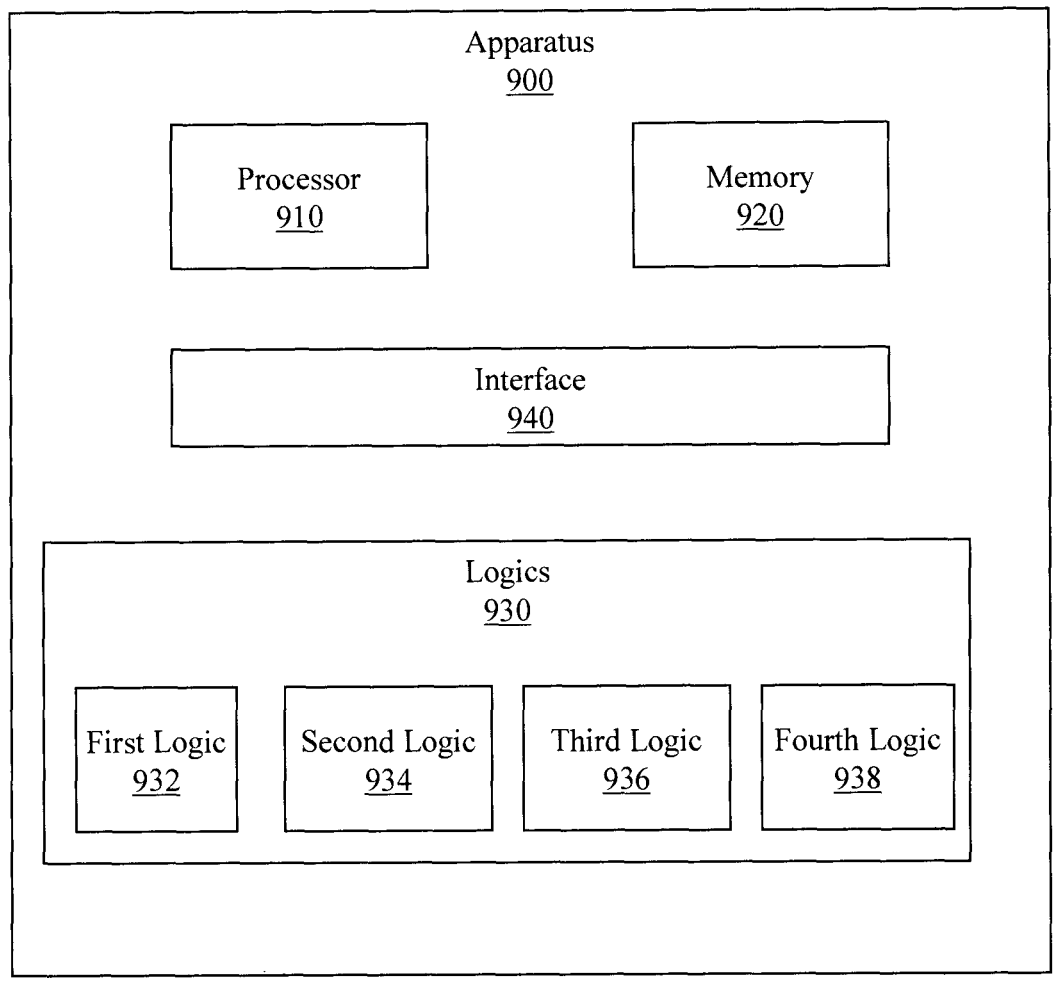
FIG. 9 illustrates an example apparatus that performs improved T2 parameter mapping.

FIG. 9 illustrates an apparatus 900 for performing MRI with artifact-free T2 mapping. Apparatus 900 includes a processor 910, a memory 920, a set 930 of logics, and an interface 940 to connect the processor 910, the memory 920, and the set 930 of logics. In one embodiment, apparatus 900 may be a special purpose computer that is created as a result of programming a general purpose computer. In another embodiment, apparatus 900 may include special purpose circuits that are added to a general purpose computer to produce a special purpose computer. In one embodiment, the set of logics 930 may control an MRI apparatus (e.g., apparatus 1000, FIG. 10) to perform T2 preparation and signal acquisition separately. The T2 preparation may include non-slice selective 3D volume excitation. The set of logics 930 produce an artifact free T2 parameter map for a sample experiencing NMR in response to the described pulse sequences.

In one embodiment, the set 930 of logics includes a first logic 932 that controls an MRI apparatus to perform 3D volume T2 preparation for the sample as part of a spin echo pulse sequence that includes separate T2 preparation and multi-echo acquisition. In one embodiment, the first logic 932 controls the MRI apparatus to perform the 3D volume T2 preparation using a 90x-180y-90x approach. The 3D volume T2 preparation includes applying a first 90x RF pulse that tips magnetization in spins in the sample in a first axis. The 3D volume T2 preparation then includes waiting a time τa and applying a 180y RF pulse that tips magnetization in spins in the sample in a second axis orthogonal to the first axis. The 3D volume T2 preparation then includes waiting a time τb and applying a second 90x RF pulse that tips the magnetization in spins in the sample in the first axis. In one embodiment, τa equals τb, and the TE between the multiple spin echoes is τ. The T2 preparation will cause multiple spin echoes to be produced.

Figure 16:
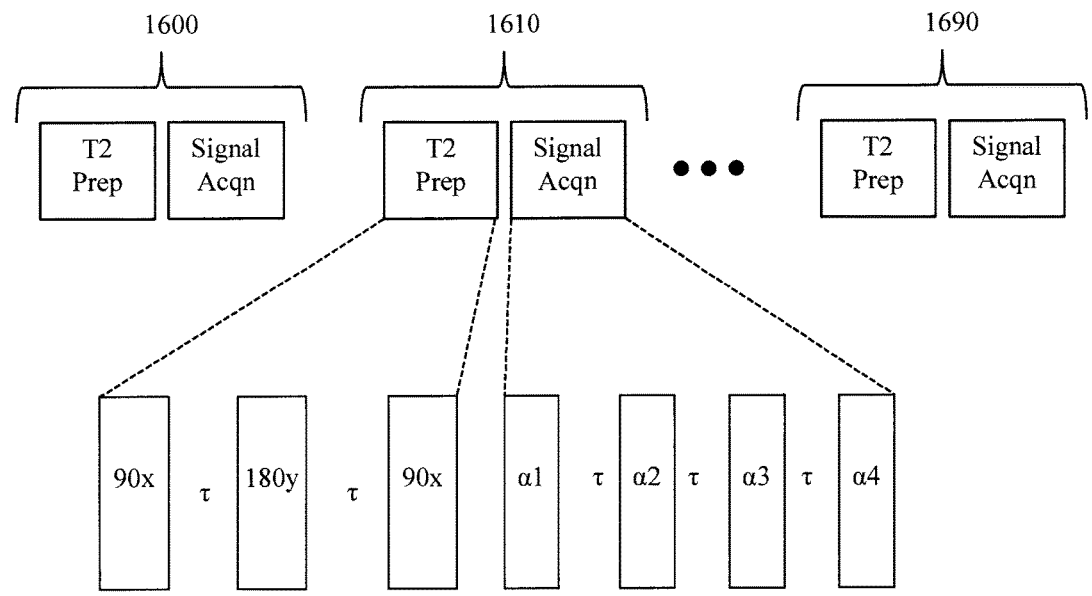
FIG. 16 illustrates an example pulse sequence.

FIG. 16 illustrates one example 90x-180y-90x preparation and subsequent image acquisition sequence. The preparation and acquisition pair (e.g., 1600, 1610, . . . 1690) may be repeated a plurality of times.

Different pulse sequences may perform the 3D volume T2 preparation in different ways. In different embodiments, the first logic 932 may cause the first 90x RF pulse to have a first duration, may cause the second 90x RF pulse to have a second duration, and may cause the 180y RF pulse to have a third duration.

Figure 17:
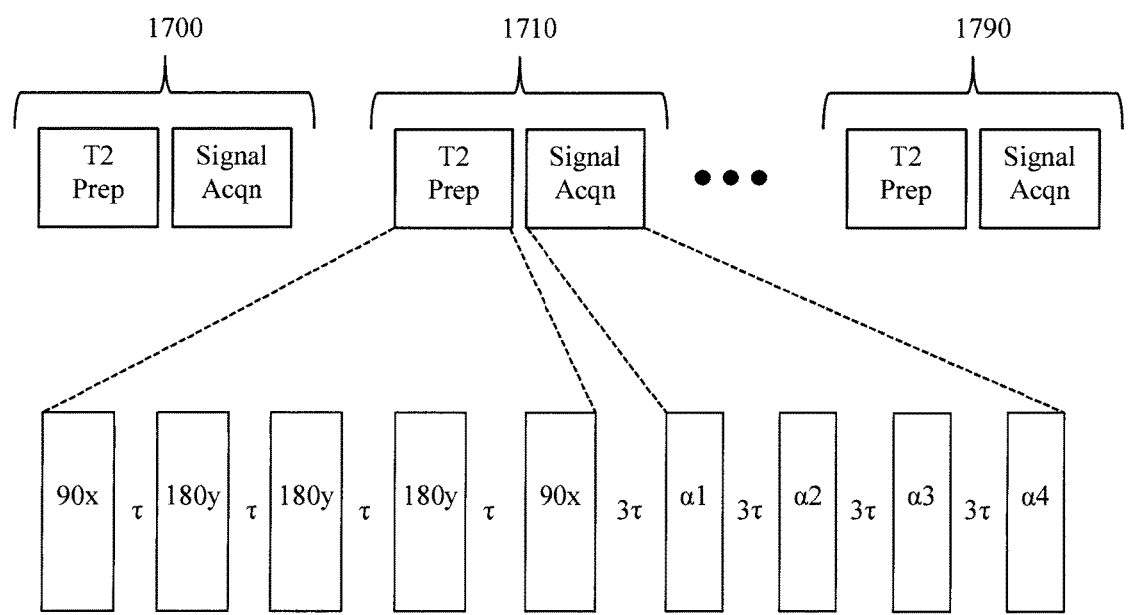
FIG. 17 illustrates an example pulse sequence.

In one embodiment, the first logic 932 controls the MRI apparatus to perform the 3D volume T2 preparation by applying a first 90x RF pulse that tips magnetization in spins in the sample in a first axis, waiting a time τa, and then applying N or more first 180y RF pulses that tip magnetization in spins in the sample in a second axis orthogonal to the first axis, N being an integer greater than one. Members of the N 180y RF pulses are separated by a time τc. The 3D volume T2 preparation then includes waiting a time τb and applying a second 90x RF pulse that tips the magnetization in spins in the sample in the first axis. In this embodiment, τa equals τb equals τc and the TE between the multiple spin echoes is N times τ. In this embodiment, the first logic 932 may cause the first 90x RF pulse to have a first duration, may cause the second 90x RF pulse to have a second duration, and may cause members of the N 180y RF pulses to have a third duration. FIG. 17 illustrates one example 90x-N180y-90x preparation and subsequent image acquisition sequence. The preparation and acquisition pair (e.g., 1700, 1710, . . . 1790) may be repeated a plurality of times.

The set of logics 930 may also include a second logic 934 that controls the MRI apparatus to acquire multiple NMR spin echoes from the sample in response to the 3D volume T2 preparation. In one embodiment, the second logic 934 controls the MRI apparatus to acquire the multiple NMR spin echoes from the sample according to an in to out k-space trajectory. An in to out k-space trajectory may start at the center of k-space and work outwards to the outer edges of k-space. In one embodiment, the second logic 934 controls the MRI apparatus to acquire the multiple NMR spin echoes according to a k-space segmentation scheme that collects one line of partition encodings per T2 preparation. In different embodiments, the second logic 934 may control the MRI apparatus to acquire the multiple NMR spin echoes according to a spiral acquisition, a parallel acquisition, a compressed SENSE acquisition, or a 3D turbo-FLASH acquisition.

The set of logics 930 may also include a third logic 936 that produces the artifact free T2 parameter map for the sample from the multiple NMR spin echoes. Unlike conventional systems where the multiple NMR spin echoes all have different errors and may have compounding errors, the spin echoes produced by apparatus 900 will all have the same error. The spin echoes will have the same error because they are produced in response to the same set of gradients and RF in the T2 preparation phase.

In one embodiment, apparatus 900 may include a fourth logic 938 that controls the MRI apparatus to perform RF saturation of spins in the sample before the T2 preparation. The fourth logic 938 may also cause the MRI apparatus to wait a period of time after the RF saturation and before the T2 preparation to allow for T1 recovery of spins in the sample.

Figure 10:
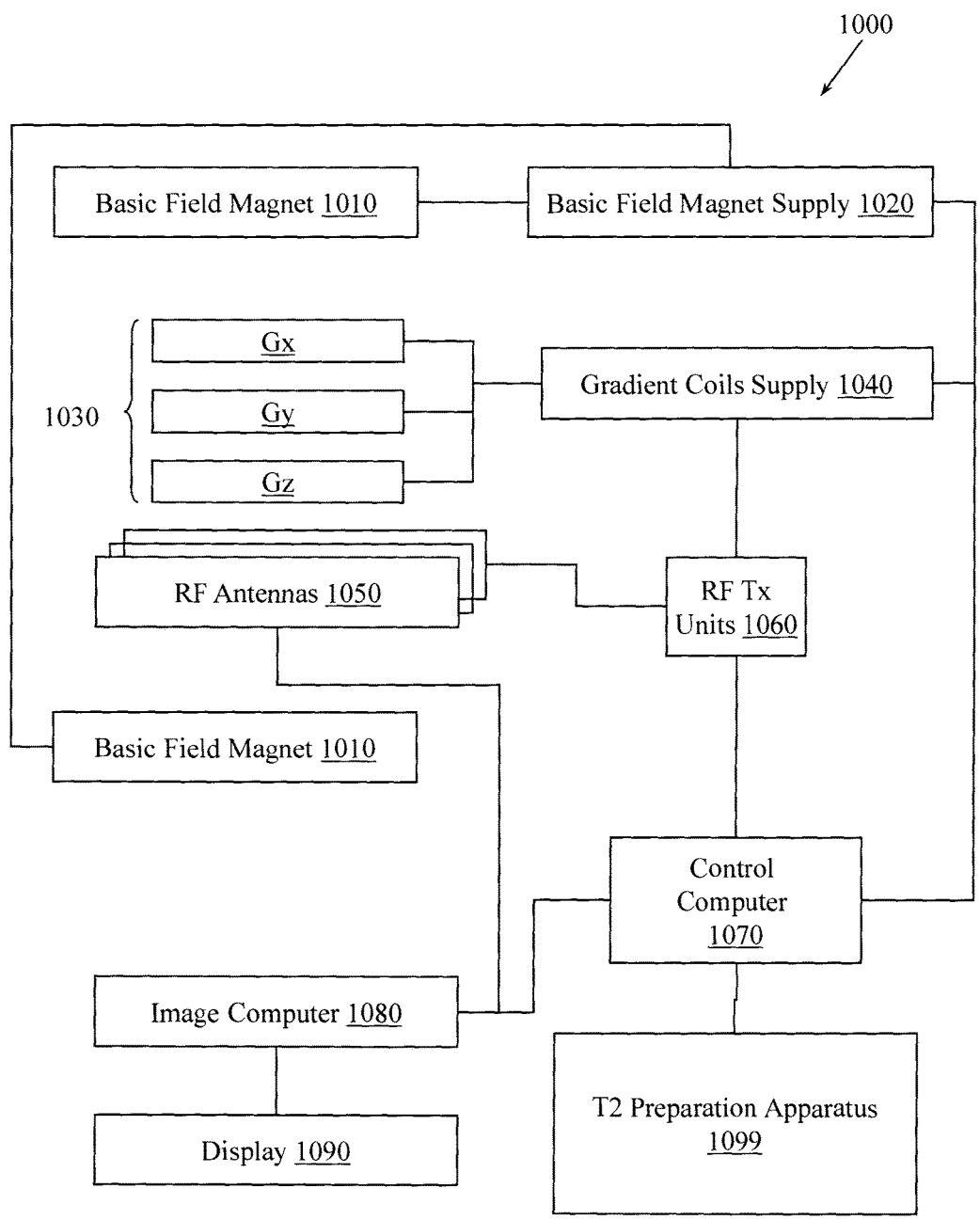
FIG. 10 illustrates an example MRI apparatus that performs improved T2 parameter mapping.

FIG. 10 illustrates an MRI apparatus 1000. MRI apparatus 1000 is configured with T2 preparation apparatus 1099. T2 preparation apparatus 1099 may be configured with elements of example apparatus described herein or may perform example methods described herein. T2 preparation apparatus 1099 may control apparatus 1000 to perform example spin echo pulse sequences having separate volume based T2 preparation and multiple spin echo acquisition. T2 preparation apparatus 1099 may also control apparatus 1000 to produce an artifact free T2 map from multiple spin echoes acquired in response to the specially crafted 3D T2 preparation.

The apparatus 1000 includes a basic field magnet(s) 1010 and a basic field magnet supply 1020. Ideally, the basic field magnets 1010 would produce a uniform B0 field. However, in practice, the B0 field may not be uniform, and may vary over an object being imaged by the MRI apparatus 1000. MRI apparatus 1000 may include gradient coils 1030 configured to emit gradient magnetic fields like $G_S$, $G_P$ and $G_R$ or Gx, Gy, and Gz. The gradient coils 1030 may be controlled, at least in part, by a gradient coils supply 1040. In some examples, the timing, strength, and orientation of the gradient magnetic fields may be controlled, and thus selectively adapted, during an MRI procedure.

MRI apparatus 1000 may include a set of RF antennas 1050 that are configured to generate RF pulses and to receive resulting NMR signals from an object to which the RF pulses are directed. In one embodiment, the RF antennas 1050 are arranged as an array of parallel transmission coils that are individually controllable. How the pulses are generated and how the resulting MR signals are received may be controlled and thus may be selectively adapted during an MR procedure. Separate RF transmission and reception coils can be employed. The RF antennas 1050 may be controlled, at least in part, by a set of RF transmission units 1060. An RF transmission unit 1060 may provide a signal to an RF antenna 1050. The RF transmission unit 1060 may provide different signals to different RF antennas to produce different RF excitations from the different members of the array of parallel transmission coils.

The gradient coils supply 1040 and the RF transmission units 1060 may be controlled, at least in part, by a control computer 1070. In one example, the control computer 1070 may be programmed to control an NMR device as described herein. Conventionally, the magnetic resonance signals received from the RF antennas 1050 can be employed to generate an image and thus may be subject to a transformation process like a two dimensional fast Fourier transform (FFT) that generates pixilated image data. The transformation can be performed by an image computer 1080 or other similar processing device. The image data may then be shown on a display 1090. While FIG. 10 illustrates an example MRI apparatus 1000 that includes various components connected in various ways, it is to be appreciated that other MRI apparatus may include other components connected in other ways.

Figure 11:
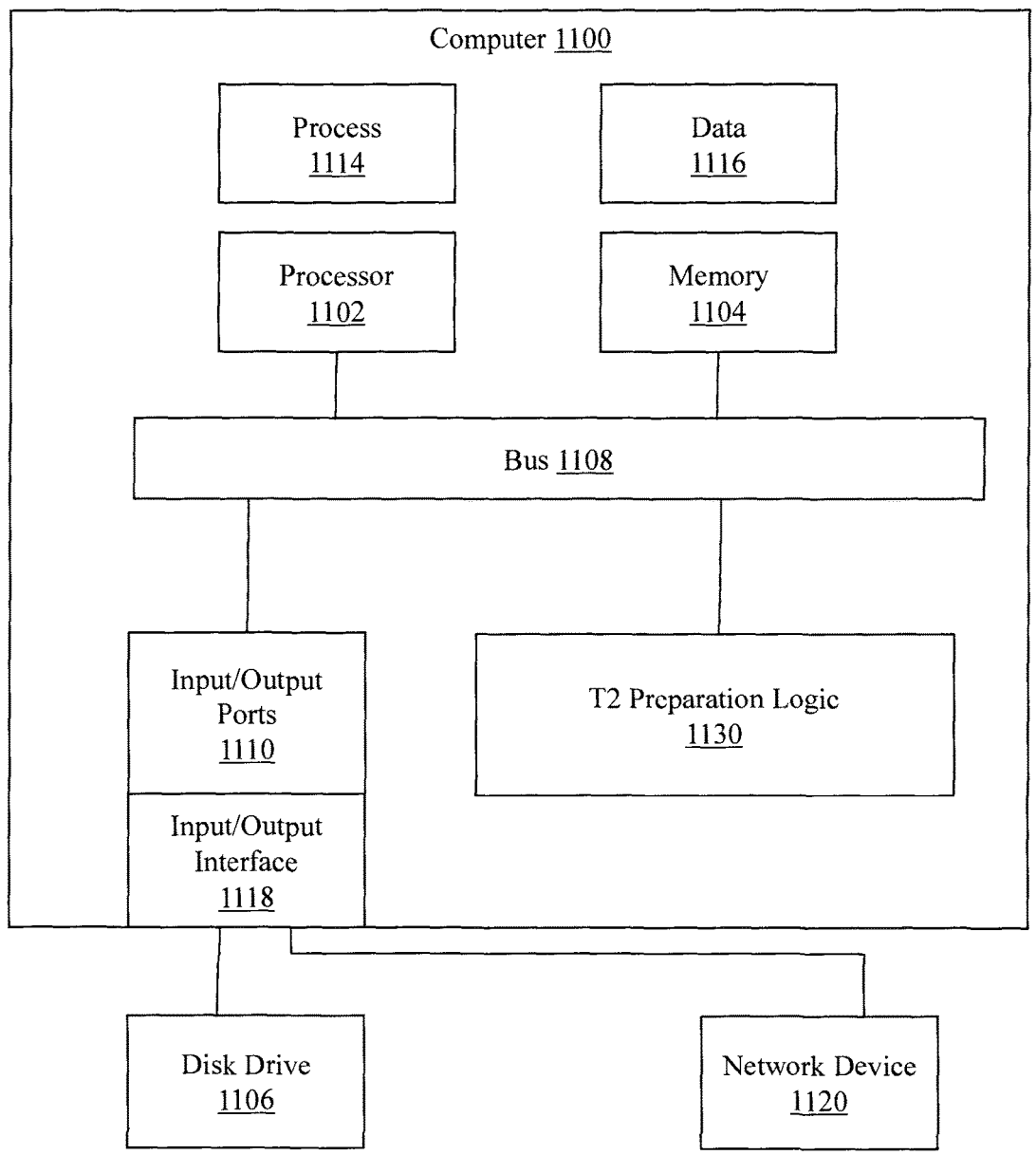
FIG. 11 illustrates an example computer that controls an MRI apparatus to perform improved T2 parameter mapping.

FIG. 11 illustrates an example computing device in which example systems and methods described herein, and equivalents, may operate. The example computing device may be a computer 1100 that includes a processor 1102, a memory 1104, and input/output ports 1110 operably connected by a bus 1108. In one example, the computer 1100 may include a T2 preparation logic 1130 that facilitates producing an artifact-free T2 mapping for MRI. In different examples, the T2 preparation logic 1130 may be implemented in hardware, software, firmware, and/or combinations thereof. While the T2 preparation logic 1130 is illustrated as a hardware component attached to the bus 1108, it is to be appreciated that in one example, the T2 preparation logic 1130 could be implemented in the processor 1102.

In one embodiment, logic 1130 may provide means (e.g., hardware, software, firmware, circuit) for controlling an MRI apparatus to perform T2 preparation for a set of spins in a sample using three dimensional non slice-selective block RF pulses. Logic 1130 may also provide means (e.g., hardware, software, firmware, circuit) for controlling the MRI apparatus to perform multi-echo spin echo acquisition from the set of spins in the sample using an in to out k-space trajectory. The multiple echoes acquired during the multi-echo spin acquisition are produced in response to the T2 preparation. Thus, the multiple echoes are all produced in response to the same set of gradients and RF energy, which reduces variability in error between echoes. Logic 1130 may also provide means (e.g., hardware, software, firmware) for controlling the MRI apparatus to produce a quantitative artifact free T2 parameter map for the sample from the multiple echoes acquired during the multi-echo spin acquisition.

The means associated with logic 1130 may be implemented, for example, as an application specific integrated circuit (ASIC). The means may also be implemented as computer executable instructions that are presented to computer 1100 as data 1116 that are temporarily stored in memory 1104 and then executed by processor 1102. In one embodiment, the functionality associated with logic 1130 may be performed, at least in part, by hardware logic components including, but not limited to, field-programmable gate arrays (FPGAs), application specific integrated circuits (ASICs), application specific standard products (ASSPs), system on a chip systems (SOCs), or complex programmable logic devices (CPLDs).

Generally describing an example configuration of the computer 1100, the processor 1102 may be a variety of various processors including dual microprocessor and other multi-processor architectures. A memory 1104 may include volatile memory and/or non-volatile memory. Non-volatile memory may include, for example, read only memory (ROM), and programmable ROM (PROM). Volatile memory may include, for example, random access memory (RAM), static RAM (SRAM), and dynamic RAM (DRAM).

A disk 1106 may be operably connected to the computer 1100 via, for example, an input/output interface (e.g., card, device) 1118 and an input/output port 1110. The disk 1106 may be, for example, a magnetic disk drive, a solid state disk drive, a floppy disk drive, a tape drive, a solid state drive (SSD), a flash memory card, or a memory stick. Furthermore, the disk 1106 may be a CD-ROM drive, a CD-R drive, a CD-RW drive, a DVD ROM drive, a Blu-Ray drive, or an HD-DVD drive. The memory 1104 can store a process 1114 and/or a data 1116, for example. The disk 1106 and/or the memory 1104 can store an operating system that controls and allocates resources of the computer 1100.

The bus 1108 may be a single internal bus interconnect architecture and/or other bus or mesh architectures. While a single bus is illustrated, it is to be appreciated that the computer 1100 may communicate with various devices, logics, and peripherals using other busses (e.g., PCIE, 1394, USB, Ethernet). The bus 1108 can be types including, for example, a memory bus, a memory controller, a peripheral bus, an external bus, a crossbar switch, and/or a local bus.

The computer 1100 may interact with input/output (i/o) devices via the i/o interfaces 1118 and the i/o ports 1110. I/O devices may be, for example, a keyboard, a microphone, a pointing and selection device, cameras, video cards, displays, the disk 1106, or the network devices 1120. The input/output ports 1110 may include, for example, serial ports, parallel ports, and USB ports.

The computer 1100 can operate in a network environment and thus may be connected to the network devices 1120 via the i/o interfaces 1118, and/or the i/o ports 1110. Through the network devices 1120, the computer 1100 may interact with a network. Through the network, the computer 1100 may be logically connected to remote computers or to an MRI apparatus. Networks with which the computer 1100 may interact include, but are not limited to, a LAN, a WAN, and other networks.

Some portions of the detailed descriptions that follow are presented in terms of algorithms and symbolic representations of operations on data bits within a memory. These algorithmic descriptions and representations are used by those skilled in the art to convey the substance of their work to others. An algorithm is considered to be a sequence of operations that produce a result. The operations may include creating and manipulating physical quantities that may take the form of electronic values. Creating or manipulating a physical quantity in the form of an electronic value produces a concrete, tangible, useful, real-world result.

It has proven convenient at times, principally for reasons of common usage, to refer to these signals as bits, values, elements, symbols, characters, terms, numbers, and other terms. It should be borne in mind, however, that these and similar terms are to be associated with the appropriate physical quantities and are merely convenient labels applied to these quantities. Unless specifically stated otherwise, it is appreciated that throughout the description, terms including processing, computing, and determining, refer to actions and processes of a computer system, logic, processor, or similar electronic device that manipulates and transforms data represented as physical quantities (e.g., electronic values).

Example methods may be better appreciated with reference to flow diagrams. For simplicity, the illustrated methodologies are shown and described as a series of blocks. However, the methodologies may not be limited by the order of the blocks because, in some embodiments, the blocks may occur in different orders than shown and described. Moreover, fewer than all the illustrated blocks may be required to implement an example methodology. Blocks may be combined or separated into multiple components. Furthermore, additional or alternative methodologies can employ additional or alternative methodologies can employ additional, not illustrated blocks.

Figure 12:
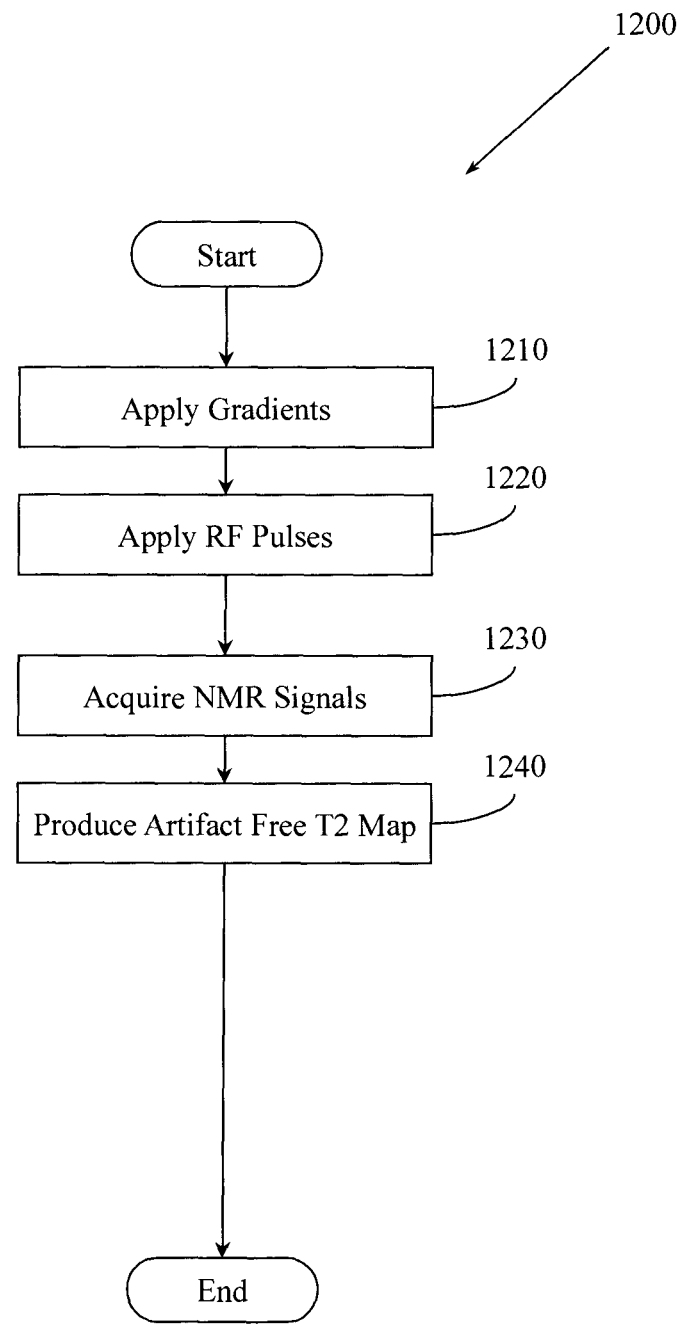
FIG. 12 illustrates an example method that controls an MRI apparatus to perform improved T2 parameter mapping.
Figure 13:
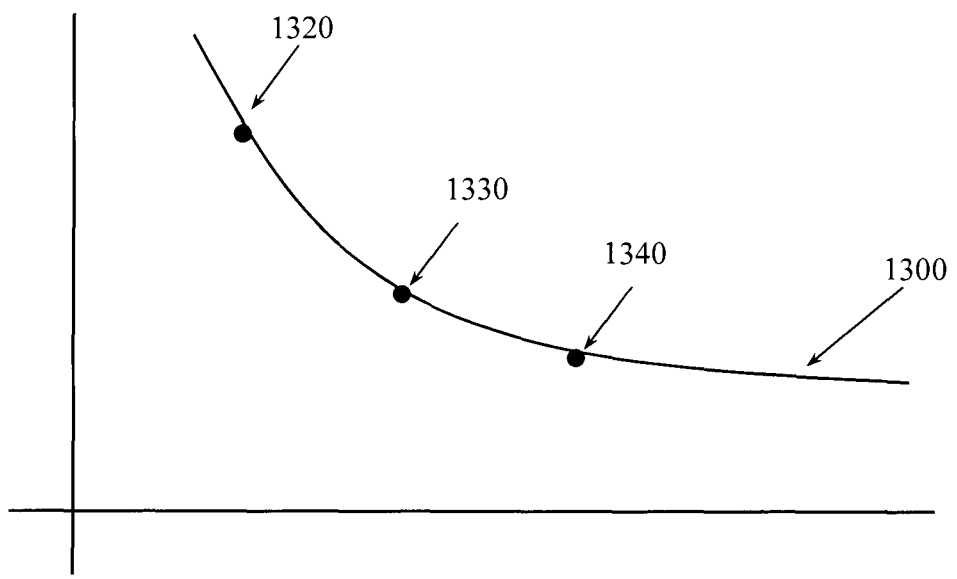
FIG. 13 illustrates example data acquired using improved T2 parameter mapping.
Figure 14:
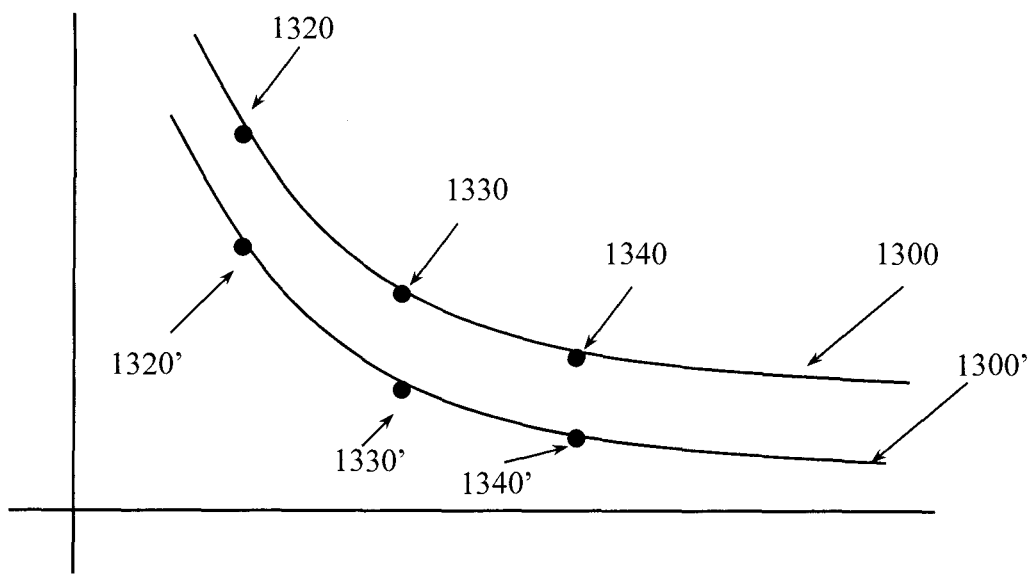
FIG. 14 illustrates example data acquired using improved T2 parameter mapping.
Figure 15:
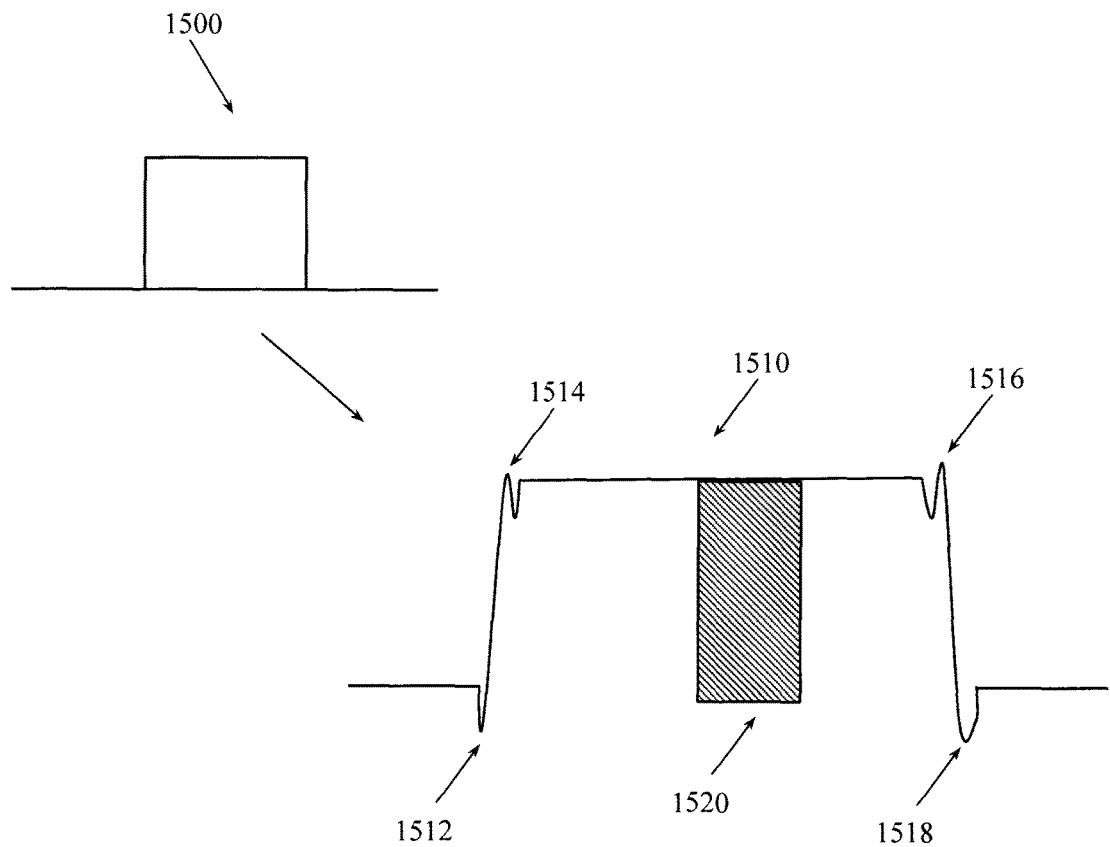
FIG. 15 illustrates mitigating the imperfect slice profile effect through three dimensional (3D) volume activation instead of two dimensional (2D) slice activation.

FIG. 12 illustrates an example method 1200 that controls an MRI apparatus to produce an artifact-free T2 map. Method 1200 may include, at 1210, programmatically controlling an MRI apparatus to apply gradients and, at 1220, programmatically controlling the MRI apparatus to apply RF pulses. The gradients and RF energy are applied to a sample according to a pulse sequence. The gradients and RF energy produce NMR in the sample. The NMR yields multiple spin echoes per T2 preparation.

In one embodiment, the pulse sequence includes a T2 preparation phase followed by a data acquisition phase. The T2 preparation phase and the data acquisition phase do not overlap in time. In one embodiment, the T2 preparation phase includes three or more 3D block non-slice selective RF pulses. The 3D block non-selective RF pulses excite a volume that may include a number of slices.

In one embodiment, the three or more 3D block non-slice selective RF pulses are arranged in a 90x-180y-90x pattern. In the 90x-180y-90x pattern, the first 90x RF pulse is separated from the 180y RF pulse by a time $\tau$ and the 180y RF pulse is separated from the second 90x RF pulse by the time $\tau$. In one embodiment, $\tau$ is in the range of 3 ms to 7 ms. The term 90x refers to the fact that the first 90x RF pulse and the second 90x RF pulse tip magnetization in spins in the sample in a first axis (e.g., x axis). The term 180y refers to the fact that the 180y RF pulse tips magnetization in spins in the sample in a second axis (e.g., y axis) orthogonal to the first axis. In one embodiment, the TE for the two or more spin echoes per T2 preparation phase is the time $\tau$. FIG. 16 illustrates one example sequence.

In one embodiment, the three or more 3D block non-slice selective RF pulses are arranged in a 90x-n{180y}-90x pattern, where n is an integer greater than one. In this pattern, there may be multiple 180y RF pulses. In this embodiment, the first 90x RF pulse is separated from the first of the n 180y RF pulses by a time $\tau$ and the last of the n 180y RF pulses is separated from the second 90x RF pulse by the time $\tau$. Members of the n{180y} RF pulses are themselves separated by the time $\tau$. In one embodiment, $\tau$ is in the range of 3 ms to 7 ms. In this embodiment, TE for the two or more spin echoes per T2 preparation phase is the time n times $\tau$. FIG. 17 illustrates one example sequence.

Method 1200 may also include, at 1230, programmatically controlling the MRI apparatus to acquire NMR signals produced in response to the gradients and RF pulses applied at 1210 and 1220. The acquired NMR signals include two or more spin echoes per T2 preparation phase. Unlike conventional 2D slice selective spin echo sequences, the two or more spin echoes are produced in response to the same applied gradients and RF energy. Thus, the two or more spin echoes are less likely to have different errors and to demonstrate compounding errors.

The signal associated with the multiple spin echoes may be acquired in different ways. Thus, method 1200 may include, at 1230, controlling the MRI apparatus to acquire the NMR signals produced by the sample using an in to out k-space trajectory. In one embodiment, acquiring the signals at 1230 may include controlling the MRI apparatus to acquire the NMR signals using a spiral acquisition, a parallel acquisition, a compressed SENSE acquisition, or a 3D turbo-FLASH acquisition. In one embodiment, the NMR signals may be acquired using a k-space segmentation approach where one line of partition encodings is collected per T2 preparation phase.

In one embodiment, work may be performed after the T2 preparation and before the signal acquisition. For example, method 1200 may also include controlling the MRI apparatus to perform gradient spoiling after the T2 preparation phase and before acquiring the NMR signals produced by the sample.

In one embodiment, work may be performed before the T2 preparation. For example, method 1200 may include controlling the MRI apparatus to perform RF saturation of the spins in the sample before the T2 preparation phase and to wait a period of time sufficient to allow T1 recovery of the spins in the sample after the RF saturations and before performing the T2 preparation.

Method 1220 also includes, at 1240, producing an artifact free T2 parameter map from the acquired NMR signals.

While FIG. 12 illustrate various actions occurring in serial, it is to be appreciated that various actions illustrated in FIG. 12 could occur substantially in parallel. By way of illustration, a first process could control T2 preparation, a second process could control signal acquisition, and a third process could control T2 parameter map preparation. While three processes are described, it is to be appreciated that a greater and/or lesser number of processes could be employed and that lightweight processes, regular processes, threads, and other approaches could be employed.

In one example, a method may be implemented as computer executable instructions. Thus, in one example, a computer-readable storage medium may store computer executable instructions that if executed by a machine (e.g., processor) cause the machine to perform a method (e.g., method 1200). While executable instructions associated with the above method are described as being stored on a computer-readable storage medium, it is to be appreciated that executable instructions associated with other example methods described herein may also be stored on a computer-readable storage medium.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the embodiments described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar exemplary language indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores instructions or data. "Computer-readable storage medium" does not refer to propagated signals, per se. A computer-readable storage medium may take forms, including, but not limited to, non-volatile media, and volatile media. Non-volatile media may include, for example, optical disks, magnetic disks, tapes, flash memory, ROM, and other media. Volatile media may include, for example, semiconductor memories, dynamic memory (e.g., dynamic random access memory (DRAM), synchronous dynamic random access memory (SDRAM), double data rate synchronous dynamic random-access memory (DDR SDRAM), etc.), and other media. Common forms of a computer-readable storage medium may include, but are not limited to, a floppy disk, a flexible disk, a hard disk, a magnetic tape, other magnetic medium, a compact disk (CD), other optical medium, a random access memory (RAM), a read only memory (ROM), a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, and other stores. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and other entities. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, and other items, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

"User", as used herein, includes but is not limited to one or more persons, software, logics, computers or other devices, or combinations of these.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

What is claimed is:

1. A non-transitory computer-readable storage medium storing instructions that when performed by a computer control the computer to perform a method to control a magnetic resonance imaging (MRI) apparatus, the method comprising:
   controlling the MRI apparatus to apply magnetic field gradients and radio frequency (RF) energy to a sample according to a pulse sequence, where the magnetic field gradients and RF energy produce nuclear magnetic resonance (NMR) in the sample;
   controlling the MRI apparatus to acquire NMR signals produced by the sample in response to the applied magnetic field gradients and RF energy; and
   producing an artifact free T2 parameter map from the acquired NMR signals,
   where the pulse sequence includes a T2 preparation phase followed by a data acquisition phase,
   where the T2 preparation phase and the data acquisition phase do not overlap in time,
   where the T2 preparation phase includes three or more three dimensional (3D) block non-slice selective RF pulses,
   where the acquired NMR signals include two or more spin echoes per T2 preparation phase, and
   where the two or more spin echoes are produced in response to the same applied magnetic field gradients and RF energy.

2. The non-transitory computer-readable storage medium of claim 1, where the three or more 3D block non-slice selective RF pulses are arranged in a 90x-180y-90x pattern, where a first 90x RF pulse is separated from a 180y RF pulse by a time τ,
   where the 180y RF pulse is separated from the second 90x RF pulse by the time τ, τ being in a range of 3 ms to 7 ms,
   where the first 90x RF pulse tips magnetization in spins in the sample in a first axis,
   where the second 90x RF pulse tips magnetization in spins in the sample in the first axis, and
   where the 180y RF pulse tips magnetization in spins in the sample in a second axis orthogonal to the first axis.

3. The non-transitory computer-readable storage medium of claim 2, where the echo time (TE) for the two or more spin echoes per T2 preparation phase is the time τ.

4. The non-transitory computer-readable storage medium of claim 1, where the three or more 3D block non-slice selective RF pulses are arranged in a 90x-n{180y}-90x pattern, n being an integer greater than one,
   where the first 90x RF pulse is separated from the first of the n 180y RF pulses by a time τ,
   where the last of then 180y RF pulses is separated from the second 90x RF pulse by the time τ, and
   where members of the n{180y} RF pulses are separated by the time τ, τ being in the range of 3 ms to 7 ms.

5. The non-transitory computer-readable storage medium of claim 4, where the echo time (TE) for the two or more spin echoes per T2 preparation phase is the time n times T.

6. The non-transitory computer-readable storage medium of claim 2, where the first 90x RF pulse has a first duration.

7. The non-transitory computer-readable storage medium of claim 6, where the second 90x RF pulse has a second duration that is different from the first duration.

8. The non-transitory computer-readable storage medium of claim 7, where the 180y RF pulse has a third duration that is different from at least one of the first duration or the second duration.

9. The non-transitory computer-readable storage medium of claim 2, comprising controlling the MRI apparatus to acquire the NMR signals produced by the sample using an in to out k-space trajectory.

10. The non-transitory computer-readable storage medium of claim 2, comprising controlling the MRI apparatus to acquire the NMR signals produced by the sample using a spiral acquisition, a parallel acquisition, a compressed SENSE acquisition, or a 3D turbo-FLASH acquisition.

11. The non-transitory computer-readable storage medium of claim 2, comprising controlling the MRI apparatus to perform gradient spoiling after the T2 preparation phase and before acquiring the NMR signals produced by the sample.

12. The non-transitory computer-readable storage medium of claim 11, comprising controlling the MRI apparatus to perform RF saturation of the spins in the sample before the T2 preparation phase and to wait a period of time sufficient to allow T1 recovery of the spins in the sample after the RF saturations and before performing the T2 preparation.

13. The non-transitory computer-readable storage medium of claim 2, comprising controlling the MRI apparatus to acquire the NMR signals using a k-space segmentation approach where one line of partition encodings is collected per T2 preparation phase.

\* \* \* \* \*